United States Patent
Hunt et al.

(10) Patent No.: US 12,107,592 B2
(45) Date of Patent: Oct. 1, 2024

(54) COMPARATOR OFFSET CORRECTION

(71) Applicant: Socionext Inc., Kanagawa (JP)

(72) Inventors: Kenneth Stephen Hunt, Maidenhead (GB); Antoine Morineau, Maidenhead (GB); Aadilhussain Maniyar, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 81 days.

(21) Appl. No.: 17/864,966

(22) Filed: Jul. 14, 2022

(65) Prior Publication Data
US 2023/0046171 A1    Feb. 16, 2023

(30) Foreign Application Priority Data

Aug. 13, 2021    (EP) ..................... 21191384

(51) Int. Cl.
*H03M 1/06* (2006.01)
*H03K 5/24* (2006.01)

(52) U.S. Cl.
CPC ........ *H03M 1/0607* (2013.01); *H03K 5/2481* (2013.01); *H03K 5/249* (2013.01)

(58) Field of Classification Search
CPC ........... H03F 3/45475; H03F 2200/375; H03F 2203/45138; H03F 2203/45212; H03F 3/45977; H03F 3/45183; H03F 1/26; H03F 2200/249; H03F 3/393; H03F 2200/261; H03F 2200/372; H03F 2203/45514; H03F 2203/45521; H03F 2203/45551; H03F 2203/45588; H03F 2203/45634;
(Continued)

(56) References Cited

U.S. PATENT DOCUMENTS

2006/0284671 A1    12/2006 Ohba
2009/0261882 A1    10/2009 Arsovski et al.
(Continued)

OTHER PUBLICATIONS

Extended European Search Report dated Feb. 14, 2022 issued in the corresponding European Patent Application No. 21191384.3.
(Continued)

*Primary Examiner* — Lincoln D Donovan
*Assistant Examiner* — Tyler J Pereny
(74) *Attorney, Agent, or Firm* — Rimon P.C.

(57) ABSTRACT

A comparator including: first and second input transistors connected to control signals at first and second nodes of the comparator; latch circuitry; at least one controllable offset-correction component having an input terminal and connected to control the signal at one of the first and second nodes based on an offset-correction signal provided at its input terminal; for each controllable offset-correction component, an offset correction circuit configured to provide the offset-correction signal provided at its input terminal; and control circuitry. The control circuitry controls the at least one offset-correction circuit to: control an amount by which the offset-correction signal is adjusted; and/or in a bypass operation, connect the input terminal of the at least one controllable offset-correction component to a bypass-operation reference voltage supply; and/or in a maintenance operation, control the charging-operation voltage supply and/or the bypass-operation voltage supply to control leakage of the charge stored on the holding capacitor.

15 Claims, 10 Drawing Sheets

(58) Field of Classification Search
CPC . H03F 2203/45682; H03F 2203/45726; H03F 2203/7206; H03F 2203/7236; H03F 3/211; H03F 3/45753; H03F 3/45973; H03F 3/45995; H03F 3/72; H03K 5/2481; H03K 5/249; H03K 3/356139; H03M 1/0607; H03M 1/1023; H03M 1/36
See application file for complete search history.

(56) References Cited

U.S. PATENT DOCUMENTS

| | | |
|---|---|---|
| 2011/0109348 A1 | 5/2011 | Chen et al. |
| 2012/0119790 A1* | 5/2012 | Chen ................ H03K 5/249 327/65 |
| 2014/0176191 A1* | 6/2014 | Kim .................. H03M 1/1023 327/50 |
| 2019/0190507 A1* | 6/2019 | Remple ................ G05F 1/575 |
| 2020/0186158 A1 | 6/2020 | Amaya Beltran et al. |

OTHER PUBLICATIONS

Jaiswal Sumit Kumar et al: "Design of a low power, high speed self calibrated dynamic latched comparator", 2020 International Symposium on Devices, Circuits and Systems (ISDCS), IEEE, Mar. 4, 2020 (Mar. 4, 2020), pp. 1-6.

* cited by examiner

COMPARATOR OFFSET CORRECTION

CROSS-REFERENCE OF RELATED APPLICATIONS

This application claims the benefit of European Patent Application No. 21191384.3, filed on Aug. 13, 2021, the entire disclosure of which Application is incorporated by reference herein.

The present invention is related to offset correction, in particular to a comparator comprising elements to correct an offset of the comparator, for example for use in an analogue-to-digital converter (ADC). Such circuitry may be implemented as integrated circuitry, for example on an IC chip.

FIG. 1 is a schematic diagram of example clocked comparator circuitry 300. Clocked comparator circuitry 300 may be referred to as latched comparator circuitry 300, and may be compared to latch circuitry known generically as a strongARM latch. The operation of the circuitry can be understood by the graphs provided alongside and commented on in more detail below.

Circuitry 300 comprises a differential pair of input transistors 302 and 304, two cross-coupled pairs of transistors 306, 308, 310 and 312, output nodes 314 and 316, intermediate nodes 318, 320, a first reference voltage source 322, a tail node 324, clocked precharge transistors 326 and 328, a clocked "compare" transistor 330 and a second reference voltage source 332, connected together as in FIG. 1.

More specifically, the differential pair of input transistors 302 and 304 are connected such that their gate terminals serve as a pair of differential inputs receiving input signals IN and /IN. These are the two comparator inputs to be compared to one another.

The two cross-coupled pairs of transistors 306, 308, 310, 312 are coupled to form two cross-coupled inverters, with transistors 306 and 310 forming one of the inverters with its output connected to output node 314, and with transistors 308 and 312 forming the other one of the inverters with its output connected to output node 316. The inverter formed by transistors 306 and 310 is connected between the intermediate node 318 and the first reference voltage source 322, in this case VDD. The inverter formed by transistors 308 and 312 is connected between the intermediate node 320 and the first reference voltage source 322. The outputs of the inverters provide the outputs, at output nodes 314 and 316, of the comparator circuitry 300.

The differential pair of input transistors 302 and 304 are connected respectively between the intermediate nodes 318 and 320 and the common tail node 324.

The precharge (or reset) transistors 326 and 328 are respectively connected between the output nodes 314 and 316 and the first reference voltage source 322. The compare (or regeneration) transistor 330 is connected between the common tail node 324 and the second reference voltage source 332, in this case ground (GND). The precharge transistors 326 and 328 and the compare transistor 330 are connected to receive a clock signal CLK, in this case a switched logic level (e.g. square wave) signal alternating between logic high (VDD) and logic low (GND), as indicated in the relevant graph.

The transistors 302, 304, 306, 308 and 330 are NMOS MOSFETs, and the transistors 310, 312, 326 and 328 are PMOS MOSFETs. Generally, the transistors are field-effect transistors (FETs).

In operation, the circuitry operates in alternating "reset" (when clock signal CLK is low) and "regeneration" (when clock signal CLK is high) phases in synchronisation with the clock signal CLK, as will be appreciated from the graphs in FIG. 1. Regeneration phases may be referred to as "compare" phases.

In the "reset" phase when the clock signal CLK is low, the precharge transistors 326 and 328 are on and pull the output nodes 314 and 316 to logic high or VDD. At this time, the compare transistor 330 is off, preventing current from flowing through e.g. the intermediate nodes 318 and 320.

As soon as the clock signal CLK goes high for the regeneration phase, the precharge transistors 326 and 328 turn off and the compare transistor 330 turns on. Importantly, the input transistors 302 and 304 are also on to a differing degree if their input signals (the comparator inputs) are slightly different from one another, as they inevitably would be (if only slightly).

The voltage levels at output nodes 314 and 316 fall as the current begins to flow, but because the transistors 302 and 304 are inevitably on to differing degrees (in practice they will not be on to exactly the same degree) the differing currents flowing through the intermediate nodes 318 and 320 cause one of these voltages to drop (perhaps only slightly) faster than the other. The cross-coupled inverters serve to accelerate and amplify this difference (in the sense of increasing the difference, at an increasing rate) causing the voltage level at one of the output nodes to drop to logic low or ground (GND) and the voltage level at the other output node to rise again to logic high or VDD. This operation, and the associated flow of current through common tail node 324, can be appreciated from the graphs in FIG. 1.

Which of the output nodes 314 and 316 goes to logic high and which goes to logic low depends on (in the ideal case, in the absence of e.g. noise) which of the input signals IN and /IN is larger, so that the voltage levels of the output signals OUT and /OUT provide the comparison result at the end of that regeneration phase. The accuracy of the circuitry 300 is therefore dependent on the correct "decision" being taken when the voltage levels at the output nodes 314 and 316 diverge under acceleration of the cross-coupled inverters.

Of course, when the next "reset" phase starts i.e. when the clock signal CLK goes low, the precharge transistors 326 and 328 turn back on and the compare transistor 330 turns back off, stopping the flow of current (such that there is no static current) and precharging the output nodes 314 and 316 to logic high or VDD again.

It will therefore be appreciated that the clocked comparator circuitry 300 serves to perform a comparison operation per clock cycle, in particular during each regeneration phase when the clock signal CLK is high, the comparison operation comparing the voltage levels of the input signals IN and /IN at that time and giving output signals OUT and /OUT which are either logic high and logic low or vice versa depending (ideally) on which of the input signals IN and /IN has the higher voltage level.

Mismatch between components in a comparator e.g. the input transistors 302, 304 in comparator circuitry 300, can reduce the accuracy of the comparison result output by the comparator. For example, the mismatch between the input transistors 302, 304 in comparator circuitry 300 may lead to a first input signal being deemed larger than a second when in fact the second is larger. It is desirable to correct this mismatch, or "offset".

In some circuitry (e.g. in an ADC), an accurate comparison by a comparator may be required, and an offset caused by differences between components inside the comparator may need to be corrected in order to achieve accurate comparison. With increasing speeds of such circuitry, and corresponding miniaturisation of semiconductor device sizes, there is ever increasing pressure on operating such circuitry accurately.

It is desirable to provide improved circuitry in the light of the above.

According to an embodiment of a first aspect of the present invention, there is provided a comparator comprising: first and second input transistors connected to control signals at first and second nodes of the comparator based on first and second input signals, respectively; and latch circuitry configured to generate a comparator output signal indicative of successive comparison results based on the signals at the first and second nodes, each comparison result indicating whether a magnitude of the first input signal is determined to be larger than a magnitude of the second input signal or vice versa; wherein the comparator further comprises: at least one controllable offset-correction component having an input terminal and connected to control the signal at one of the first and second nodes based on an offset-correction signal provided at its input terminal; for each (or for at least one) controllable offset-correction component, an offset correction circuit configured to provide the offset-correction signal provided at its input terminal; and control circuitry, wherein: the at least one offset-correction circuit comprises a holding capacitor, a supply capacitor and switching circuitry, the holding capacitor connected to the input terminal of the offset-correction component concerned and configured to provide the offset-correction signal at the input terminal concerned based on charge stored on that holding capacitor; for the at least one offset-correction circuit, the switching circuitry is configured, in a charging operation, to connect the supply capacitor to a charging-operation voltage supply to store charge on that capacitor, and, in a charge-sharing operation, to disconnect the supply capacitor from the charging-operation voltage supply and connect it to the holding capacitor to adjust the charge stored on the holding capacitor (through charge sharing between the supply and holding capacitors) and thereby adjust the offset-correction signal; and the control circuitry is configured, based on a control signal, to control the at least one offset-correction circuit to: control an amount by which the offset-correction signal (concerned) is adjusted, wherein the control circuitry comprises determination circuitry configured to determine a target amount of adjustment of the offset-correction signal (concerned), and to control the control signal to control the amount by which the offset-correction signal (concerned) is adjusted to bring that amount to or towards the target amount; and/or in a bypass operation, connect the input terminal of the at least one controllable offset-correction component to a bypass-operation reference voltage supply to control the offset-correction signal (concerned) based on a voltage level of the bypass-operation voltage supply, the bypass-operation voltage supply being the charging-operation voltage supply or another voltage supply; and/or in a maintenance operation between instances of a charging operation followed by a charge-sharing operation, control the charging-operation voltage supply and/or the bypass-operation voltage supply (concerned) to control leakage of the charge stored on the holding capacitor (concerned).

Such a comparator is a high-speed and low-offset comparator. Such a comparator is able to reach a very high resolution, and with a mostly passive implementation the current consumption is very low. Power may only be used when calibration (adjustment of the/each offset-correction signal) is needed.

By controlling an amount by which the offset-correction signal is adjusted to bring that amount to or towards a target amount, the "step-size" of an offset correction may be adjusted, and therefore e.g. the speed/accuracy at which the offset is compensated may be adjusted.

By controlling the bypass-operation reference voltage supply, a coarse value of the offset in the comparator may be measured and the calibration may start at this value to perform the offset-correction more quickly/accurately.

By controlling the charging-operation voltage supply and/or the bypass-operation voltage supply in a maintenance operation to control leakage of the charge stored on the holding capacitor, the frequency of performing calibration needed to achieve a particular offset-cancellation may be reduced.

Said first and second input signals may be input signals of the first and second input transistors, respectively.

Said first and second input signals may be first and second input gate signals, respectively.

The control circuitry may be configured, based on the control signal, to control the at least one offset-correction circuit to control a rate at which the offset-correction signal (concerned) is adjusted. The control circuitry may comprise determination circuitry (or the determination circuitry may be) configured to determine a target rate of adjustment of the offset-correction signal (concerned), and to control the control signal to control the rate at which the offset-correction signal (concerned) is adjusted to bring that rate to or towards the target rate.

The determination circuitry may be configured to determine the target amount and/or the target rate based on at least one of: a defined performance specification; a history of the comparison results; a history of amounts and/or determined target amounts; and a history of rates and/or determined target rates.

The control circuitry may be configured, in a calibration mode, to: control the first and second input signals such that they become equal; and control the switching circuitry of the at least one offset-correction circuit (or the at least one of the offset-correction circuits) to alternate between charging and charge-sharing operations until successive comparison results differ from one another.

The control circuitry may be configured to control the at least one offset-correction circuit (or the at least one of the offset-correction circuits) (to control the amount by which, or the rate at which, the offset-correction signal concerned is adjusted) by controlling, for the at least one offset-correction circuit (or the at least one of the offset-correction circuits), at least one of: a voltage level of the charging-operation voltage supply; a capacitance of the holding capacitor; a capacitance of the supply capacitor; the switching circuitry to control when the charging operation and/or the charge-sharing operation is carried out; and the switching circuitry to control a duration of the charging operation and/or a duration of the charge-sharing operation.

The charging-operation voltage supply may comprise first and second reference voltage supplies. The control circuitry may be configured to control/change, for the at least one offset-correction circuit (or the at least one of the offset-correction circuits), a/the voltage level of the charging-operation voltage supply by controlling which of the first and second reference voltage supplies the supply capacitor is connected to.

The control circuitry may be configured, for the at least one offset-correction circuit (or the at least one of the offset-correction circuits), to control the amount by which, or the rate at which, the offset-correction signal (concerned)

is adjusted by adjusting the charging-operation voltage supply or the first reference voltage supply or the second reference voltage supply.

The control circuitry may be configured to control the at least one offset-correction circuit (or the at least one of the offset-correction circuits) by controlling, for the at least one offset-correction circuit (or the at least one of the offset-correction circuits), at least one of: the switching circuitry to control when the bypass operation is carried out; and a voltage level of the bypass-operation voltage supply.

The control circuitry may be configured to control the at least one offset-correction circuit (or the at least one of the offset-correction circuits) to carry out a bypass operation and then at least one instance of a charging operation followed by a charge-sharing operation.

The control circuitry may be configured to control the at least one offset-correction circuit (or the at least one of the offset-correction circuits) to carry out a maintenance operation between one instance of a charging operation followed by a charge-sharing operation and another instance of a charging operation followed by a charge-sharing operation.

The control circuitry may be configured to control the at least one offset-correction circuit (or the at least one of the offset-correction circuits), in a maintenance operation, to at least partly disconnect: the supply capacitor from the charging-operation voltage supply and/or the bypass-operation voltage supply; and/or the supply capacitor from the holding capacitor; and/or the holding capacitor from the charging-operation voltage supply and/or the bypass-operation voltage supply.

The control circuitry may be configured to control the at least one offset-correction circuit (or the at least one of the offset-correction circuits), in a maintenance operation, to control the charging-operation voltage supply and/or the bypass-operation voltage supply based on a measure of the offset-correction signal concerned or based on a history of the comparison results.

For the at least one offset-correction circuit (or the at least one of the offset-correction circuits), the switching circuitry may comprise a charging switch connected between the supply capacitor and the charging-operation voltage supply and a sharing switch connected between the supply capacitor and the holding capacitor.

The control circuitry may be configured, for the at least one offset-correction circuit (or the at least one of the offset-correction circuits), to control the switching circuitry to: turn the charging switch ON and the sharing switch OFF to carry out the charging operation;

and/or turn the charging switch OFF and the sharing switch ON to carry out the charge-sharing operation; and/or turn the charging switch ON and the sharing switch ON to carry out the bypass operation; and/or turn the charging switch OFF and the sharing switch OFF to carry out the maintenance operation.

For the at least one offset-correction circuit (or the at least one of the offset-correction circuits), the charging switch may comprise a first charging switch connected between a/the first reference voltage supply and the supply capacitor and a second charging switch connected between a/the second reference voltage supply and the supply capacitor. Turning the charging switch ON may comprise turning one of the first and second charging switches ON and the other of the first and second charging switches OFF. Turning the charging switch OFF may comprise turning both the first and second charging switches OFF.

The (or each) at least one controllable offset-correction component may be a transistor, its input terminal being its gate terminal and its offset-correction signal being a gate signal.

The (or each) at least one controllable offset-correction component may be a variable resistor, its offset-correction signal configured to control its resistance.

The at least one controllable offset-correction component may be connected in series with the one of the first and second input transistors.

The comparator may comprise first and second said controllable offset correction components as the at least one controllable offset-correction component, the first and second controllable offset-correction components having respective said input terminals and connected to control the signals at the first and second nodes based on first and second said offset-correction signals provided at their input terminals, respectively.

Each offset-correction component may be connected to its one of the first and second nodes along a different current path from a current path along which the one of the first and second input transistors which is connected to that one of the first and second nodes is connected so that a current carried by that offset-correction component is different from a current carried by said one of the first and second input transistors.

The first and second controllable offset-correction components may be connected in series with the first and second input transistors, respectively.

According to an embodiment of a second aspect of the present invention, there is provided a comparator comprising: first and second input transistors connected to control signals at first and second nodes of the comparator based on first and second input signals, respectively; latch circuitry configured to generate a comparator output signal indicative of successive comparison results based on the signals at the first and second nodes, each comparison result indicating whether a magnitude of the first input signal is determined to be larger than a magnitude of the second input signal or vice versa; first and second controllable offset-correction components having respective input terminals and connected to control the signals at the first and second nodes based on first and second offset-correction signals provided at their input terminals, respectively; first and second offset-correction circuits configured to provide the first and second offset-correction signals provided at the input terminals of the first and second controllable offset-correction components, respectively; and control circuitry, wherein: at least one (or both) of the offset-correction circuits comprises a holding capacitor, a supply capacitor and switching circuitry, the holding capacitor connected to the input terminal of the offset-correction component concerned and configured to provide the offset-correction signal at the input terminal concerned based on charge stored on that holding capacitor; for the at least one (or each) of the offset-correction circuits, the switching circuitry is configured, in a charging operation, to connect the supply capacitor to a charging-operation voltage supply to store charge on that capacitor, and, in a charge-sharing operation, to disconnect the supply capacitor from the charging-operation voltage supply and connect it to the holding capacitor to adjust the charge stored on the holding capacitor (through charge sharing between the supply and holding capacitors) and thereby adjust the offset-correction signal; and the control circuitry is configured, based on a control signal, to control the at least one offset-correction circuit (or both of the offset-correction circuits) to: control an amount by which the offset-correction signal is (or the offset-correction signals are) adjusted, wherein the control circuitry comprises determination circuitry configured to determine a target amount of adjustment of the offset-correction signal (or of the offset-correction signals), and to control the control signal to control the amount by which the offset-correction signal is (or the offset-correction signals are) adjusted to bring that amount to or towards the target amount; and/or in a bypass operation, connect the input terminal of at least one of (or both of) the controllable offset-correction components to a bypass-operation reference voltage supply to control the offset-correction signal concerned based on a voltage level of the bypass-operation voltage supply concerned, the bypass-operation voltage supply being the charging-operation voltage supply or another voltage supply (or each bypass-operation voltage supply being the corresponding charging-operation voltage supply or another voltage supply); and/or in a maintenance operation between instances of a charging operation followed by a charge-sharing operation, control the charging-operation voltage supply and/or the bypass-operation voltage supply (for one of both of the offset-correction circuits) to control leakage of the charge stored on the holding capacitor concerned.

According to an embodiment of a third aspect of the present invention, there is provided a comparator comprising: first and second input transistors connected to control signals at first and second nodes of the comparator based on first and second input signals, respectively; and latch circuitry configured to generate a comparator output signal indicative of successive comparison results based on the signals at the first and second nodes, each comparison result indicating whether a magnitude of the first input signal is determined to be larger than a magnitude of the second input signal or vice versa; wherein the comparator further comprises: at least one controllable offset-correction component having an input terminal and connected to control the signal at one of the first and second nodes based on an offset-correction signal provided at its input terminal;

and for each controllable offset-correction component, an offset correction circuit configured to provide the offset-correction signal provided at its input terminal, wherein: the at least one offset-correction circuit comprises a holding capacitor, a supply capacitor and switching circuitry, the holding capacitor connected to the input terminal of the offset-correction component concerned and configured to provide the offset-correction signal at the input terminal concerned based on charge stored on that holding capacitor; and for the at least one offset-correction circuit, the switching circuitry is configured, in a charging operation, to connect the supply capacitor to a charging-operation voltage supply to store charge on that capacitor, and, in a charge-sharing operation, to disconnect the supply capacitor from the charging-operation voltage supply and connect it to the holding capacitor to adjust the charge stored on the holding capacitor (through charge sharing between the supply and holding capacitors) and thereby adjust the offset-correction signal.

According to an embodiment of a fourth aspect of the present invention, there is provided an analogue-to-digital converter comprising the comparator of any of the first to third aspects.

According to an embodiment of a fifth aspect of the present invention, there is provided integrated circuitry, such as an IC chip, comprising the comparator of any of the first to third aspects or the analogue-to-digital converter of the fourth aspect.

Features of any of the above aspects may be applied to any others of the above aspects.

Reference will now be made, by way of example, to the accompanying drawings, of which:

FIG. 1, mentioned above, is a schematic diagram of a comparator as a comparative example;

Figure 2:
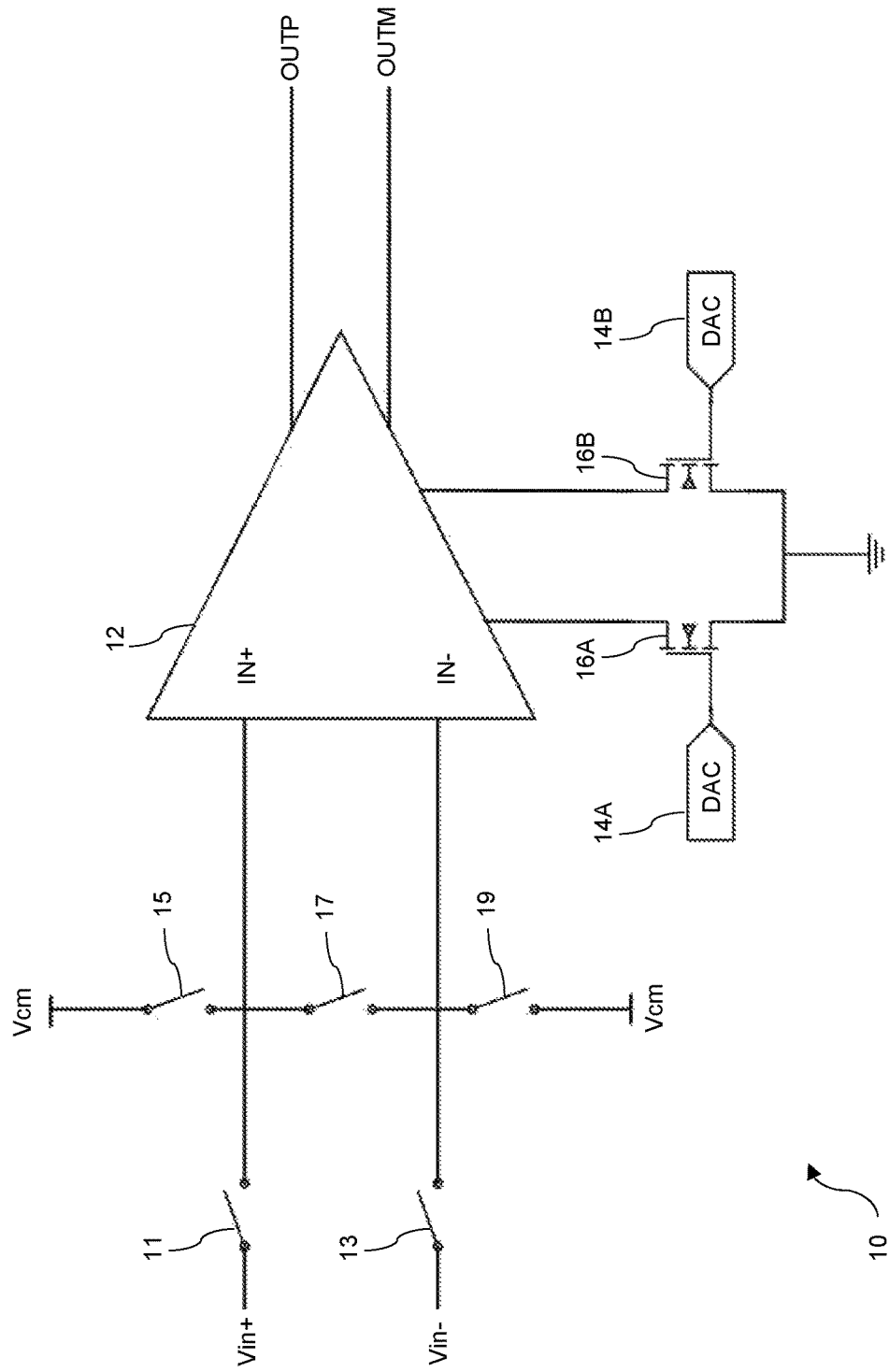
FIG. 2 is a schematic diagram of a comparator as a comparative example.

FIG. 2 is a schematic diagram of a comparator 10 as a comparative example. Comparator 10 comprises comparator circuitry 12, switches 11, 13, 15, 17, and 19, digital-to-analogue converters (DACs) 14A and 14B, and transistors 16A and 16B. Comparator circuitry 12 is configured to receive input signals at its inputs IN+ and IN− and output signals OUTP and OUTM indicating a result of a comparison between the input signals. The switches 11, 13, 15, 17, and 19 are for controlling whether the comparator 10 is being used for comparison of input signals Vin+ and Vin− (switches 11 and 13 closed, switches 15, 17, 19 open) or for calibration (switches 15, 17, 19 closed, switches 11 and 13 open).

Whilst being calibrated, the comparator circuitry 12 receives as its input signals identical signals by virtue of the switches 11, 13, 15, 17, and 19. In an example, during calibration the input signals to the comparator 12 are shorted with switches 15 and 19 to a calibration reference voltage equal to the common mode operating potential of the comparator (Vcm) and shorted together with switch 17 to ensure the input differential voltage is zero, as indicated in FIG. 2. Therefore ideally, with no offset, the comparator output would indicate that the input signals are identical. Of course, in practice the comparator circuitry 12 may still see a difference between the two input signals for example due to the offset caused by mismatch of components inside the comparator circuitry 12.

DACs 14A and 14B control a voltage applied to the gates of the transistors 16A and 16B, respectively, which then control corresponding (voltage) signals inside of comparator circuitry 12. During calibration, the voltages applied by the DACs 14A and 14B are adjusted until the comparator output flips and may be continually adjusted to keep causing the comparator output to flip, in order to correct the offset in comparator circuitry 12. These voltages are applied by the DACs 14A and 14B during normal comparison by comparator circuitry 12 so that the offset is corrected for or compensated for.

Figure 3:
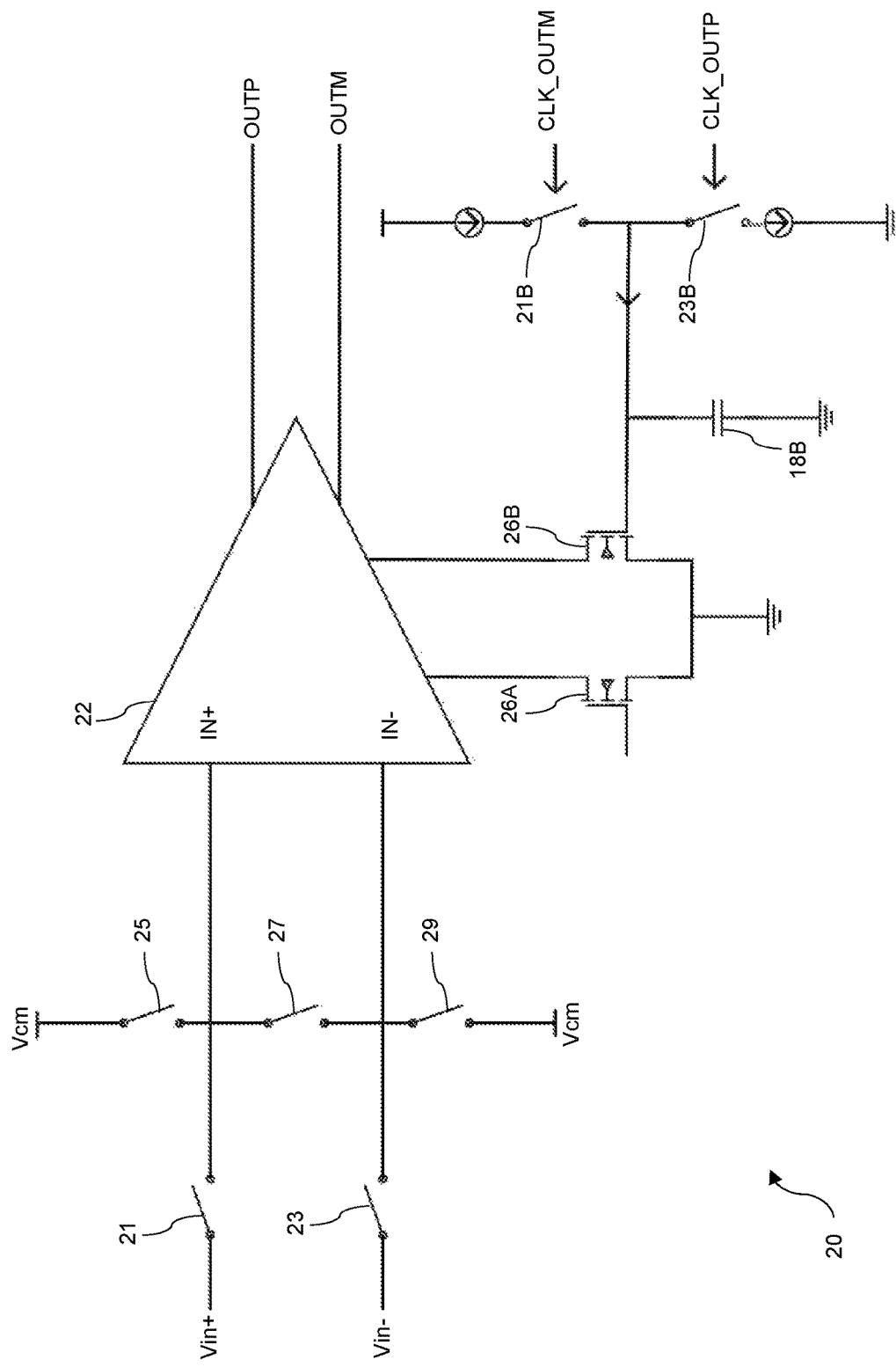
FIG. 3 is a schematic diagram of a comparator as a comparative example.

FIG. 3 is a schematic diagram of a comparator 20 as a comparative example. Elements that the comparator 20 has in common with the comparator 10 have been given like reference numerals (with a "2" at the start for the comparator 20 instead of a "1" at the start for the comparator 10). Such elements work in the same way as described above with reference to the comparator 10 and duplicate description is omitted.

The comparator 20 comprises a capacitor 18B and switches 21B and 23B instead of the DAC 14B of comparator 10, to generate/adjust the voltage applied to the transistor 26B. The switches 21B and 23B are controlled by signals CLK_OUTM and CLK_OUTP during calibration and are based respectively on the output signals OUTM and OUTP of the comparator circuitry 22 as well as on a clock signal controlling the comparator circuitry 22. The switches 21B and 23B are connected together in series between current sources and are controlled by the signals CLK_OUTM and CLK_OUTP during calibration to correct the offset of the comparator circuitry 22. The capacitor 18B is charged or discharged depending on which of switches 21B and 23B is ON and in this way the magnitude of the voltage applied to the transistor 26B is controlled.

Although not shown, the transistor 26A is supplied with a voltage generated in similar manner by a corresponding capacitor and corresponding switches.

Figure 4:
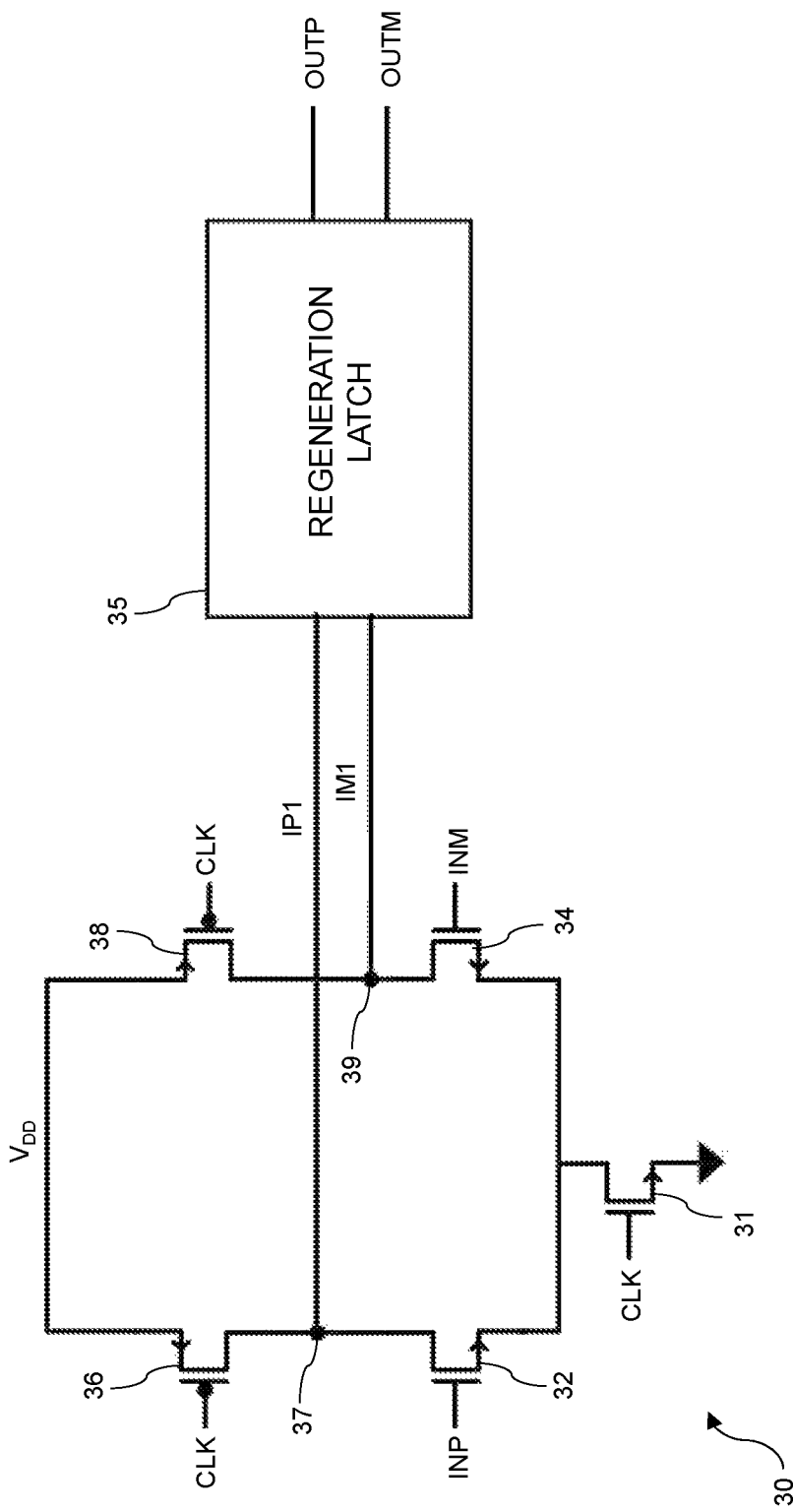
FIG. 4 is a schematic diagram of a comparator as a comparative example.

FIG. 4 is a schematic diagram of comparator circuitry 30 as a comparative example. Comparator circuitry 30 comprises first and second input transistors 32 and 34 configured to receive first and second input signals (or input gate signals) INP and INM, respectively. Comparator circuitry 30 further comprises first and second clocked precharge transistors 36 and 38, a clocked "compare" transistor 31, and a regeneration latch 35 (which may be e.g. a strongARM latch). The regeneration latch 35 (optionally together with the second clocked precharge transistors 36 and 38) may be referred to as latch circuitry.

Figure 1:
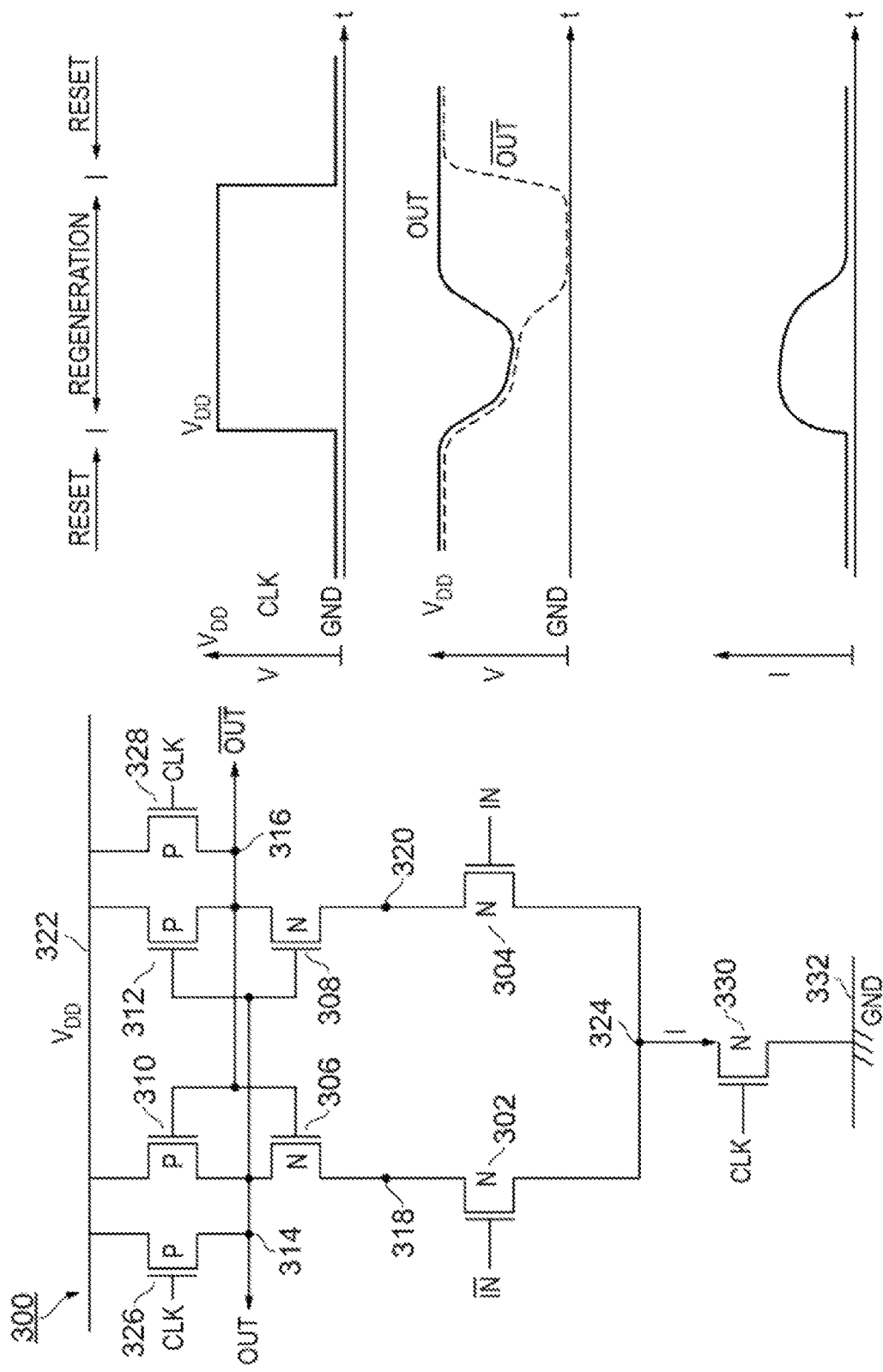

Looking at FIGS. 1 and 4, the first and second input transistors 32 and 34 correspond to the input transistors 302 and 304, the clocked "compare" transistor 31 corresponds to the clocked "compare" transistor 330, and the first and second clocked precharge transistors 36 and 38 correspond to the clocked precharge transistors 326 and 328. The regeneration latch 35 of comparator circuitry 30 in FIG. 4 may be considered to correspond to the rest of the elements of comparator circuitry 300 in FIG. 1 (i.e. the cross-coupled inverters). That is, the comparator circuitry 30 may be considered to be the same as comparator circuitry 300 but illustrated in a different way. Of course, it will be appreciated that there are also other possible arrangements and the regeneration latch 35 is not limited to have a structure as illustrated in FIG. 1.

The operation of comparator circuitry 30 is the same as or corresponds to the operation of comparator circuitry 300. For completeness, basically, the comparator circuitry 30 operates in three stages: Precharge (or reset), Amplification, and Regeneration.

In precharge (or reset) mode CLK goes low, first and second nodes 37 and 39 (which are respectively connected to the input transistors 42 and 44) outputting signals IP1 and IM1 get pulled up (in terms of their voltages) by the clocked precharge transistors 36 and 38, respectively. Amplification mode starts on the rising edge of CLK. The clocked precharge transistors 36 and 38 get turned off and the clocked "compare" transistor 31 gets turned on and based on the differential input signal (INP-INM), the input transistors 32 and 34 pull down (in terms of their voltages) the nodes 47 and 49 outputting the signals IP1 and IM1, respectively. In regeneration mode, when the nodes 47 and 49 outputting IP1 and IM1 go down, the regeneration latch makes the decision (i.e. operates to output the signals OUTP and OUTM) based on the signals IP1 and IM1 (specifically, the difference between those signals, i.e. IP1-IM1). The signals IP1 and IM1 can therefore be considered intermediate signals upon which the regeneration latch, and ultimately the comparator circuitry 30, outputs its output signals OUTP and OUTM.

Figure 5:
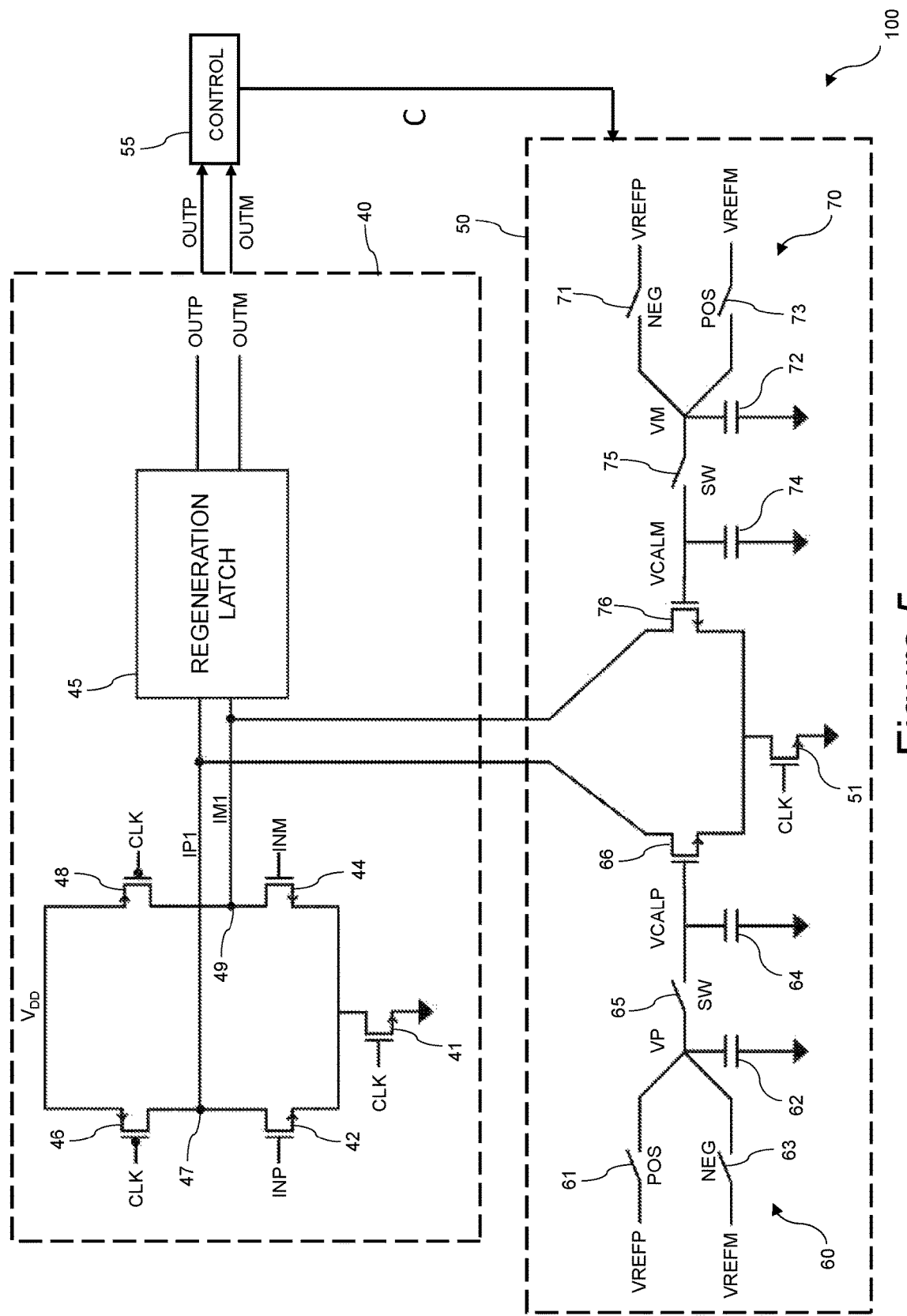
FIG. 5 is a schematic diagram of a comparator.

FIG. 5 is a schematic diagram of a comparator 100. The comparator 100 comprises comparator circuitry 40 which corresponds to comparator circuitry 30, and the elements in comparator circuitry 40 have reference numerals corresponding to those of corresponding elements in comparator circuitry 30 (starting with a "4" instead of a "3"). Duplicate description of the comparator circuitry 40 is omitted, because it is the same as that of comparator circuitry 30 described above.

The comparator 100 further comprises offset correction circuitry 50. Offset correction circuitry 50 comprises a controller (control circuitry) 55, marked simply as "control", first and second offset-correction circuits 60 and 70, a clocked tail transistor 51, and first and second offset-correction components 66 and 76 which may be referred to as controllable offset-correction components.

The controller 55 may be considered to be separate from the offset correction circuitry 50. The first and second offset-correction circuits 60 and 70 may be considered to comprise the first and second offset-correction components 66 and 76, respectively.

The first and second offset-correction components 66 and 76 each comprise an input terminal and are connected to the first and second nodes 47 and 49 to control the intermediate signals IP1 and IM1 based on first and second offset-correction signals provided at their input terminals, respectively. The first and second offset-correction circuits 60 and 70 are configured to provide the first and second offset-correction signals at the input terminals of the first and second offset-correction components 66 and 76, respectively.

The first offset-correction circuit 60 comprises first and second charging switches 61 and 63, a supply capacitor 62, a sharing switch 65, and a holding capacitor 64. The first charging switch 61 is connected between a first reference voltage supply VREFP and a node labelled VP. The second charging switch 63 is connected between a second reference voltage supply VREFM and the node labelled VP. The supply capacitor 62 is connected between the node labelled VP and a low voltage reference e.g. ground (GND).

The sharing switch 65 is connected between the node labelled VP and the input terminal of the first offset-correction component 66. The holding capacitor 64 is connected between the sharing switch 65 (or the input terminal of the first offset-correction component 66) and a low voltage reference, e.g. ground (GND).

The switches 61, 63, and 65 (optionally including switches 71, 73, and 75 described below) may collectively be referred to as switching circuitry. The first and second charging switches 61 and 63 may collectively be referred to as a charging switch. The first and second reference voltage supplied VREFP and VREFM may be considered a charging-operation voltage supply and the operation of turning one of the first and second charging switches 61 and 63 ON and the other OFF may be considered to be adjusting/controlling the voltage level of the charging-operation voltage supply.

Considering the operation of the first offset-correction circuit 60, the holding capacitor 64 connected to the input terminal of the first offset-correction component 66 is configured to provide the first offset-correction signal at the input terminal based on the charge stored on the holding capacitor 64.

In a calibration mode, the controller 55 is configured to control the offset correction circuitry 50 to adjust the first and/or second offset-correction signals to thus adjust how the first and/or second signals IP1 and IM1 are controlled by the first and/or second offset-correction components 66 and 76. Otherwise (i.e. in a normal mode of operation of comparator 100), the controller 55 controls the switching circuitry so that all the switches are open thus not adjusting either offset correction signal, so that the control of the signals IP1 and IM1 by the offset-correction components 66 and 76 is maintained and not changed (subject, of course, to charge leakage from the holding capacitors 64 and 74, and active devices such as the switches). The clocked tail transistor 51 is clocked by the clock signal CLK which clocks the comparator circuitry 40.

The operation of the comparator 100 in the calibration mode will now be described.

The charge stored on the holding capacitor 64 and therefore the first offset-correction signal is adjusted as follows. The switching circuitry is configured, in a charging operation, to connect the supply capacitor 62 to the charging-operation voltage supply to store charge on supply capacitor 62. In particular, the controller 55 controls the charging switch (one of the first and second charging switches 61 and 63) to be ON and the sharing switch 65 to be OFF. The switching circuitry is configured to then, in a charge-sharing operation, disconnect the supply capacitor 62 from the charging-operation voltage supply and connect it to the holding capacitor 64 to adjust the charge stored on the holding capacitor 64 through charge sharing between the supply and holding capacitors 62 and 64, and thereby adjust the first offset-correction signal, which is labelled as VCALP in FIG. 5. In particular, the controller 55 controls the charging switch (i.e. both of the first and second charging switches 61 and 63) to be OFF and the sharing switch 65 to be ON.

Similarly, the second offset-correction circuit 70 comprises first and second charging switches 71 and 73, a supply capacitor 72, a sharing switch 75, and a holding capacitor 74, which are connected together in the same manner as those elements of the first offset-correction circuit 60 as shown in FIG. 5. Corresponding considerations apply (e.g. regarding the charging-operation voltage supply, and switching circuitry). The operation of the second offset-correction circuit 70 corresponds to the operation of the first offset-correction circuit 60. Duplicate description is omitted.

Considering the first offset-correction circuit 60, when controlling which one of the first and second charging switches 61 and 63 is ON and which is OFF during the charging operation, the controller 55 operates as follows. The controller 55 controls the first and second input gate signals INP and INM such that they are/become equal, and receives the output signals OUTP and OUTM from the comparator circuitry 40. Based on the output signals OUTP and OUTM indicating which intermediate signal is higher, the controller 55 determines which one of the first and second charging switches 61 and 63 to turn ON. For example, if the output signals OUTP and OUTM indicate that the first intermediate signal IP1 is higher than the second (e.g. due to mismatch between the input transistors 42 and 44) then the controller 55 determines that the first switch 61 should be turned ON during the charging operation to ultimately increase the first offset-correction signal to reduce the voltage of the signal IP1.

In more detail, during the calibration mode, the comparator inputs (i.e. INP and INM) are shorted together. Based on the comparator decision (output signals OUTP and OUTM), the controller 55 generates POS or NEG pulses along with an SW pulse to update/adjust the first and second offset-correction signals VCALP and VCALM. The pulse POS turns ON the switches 61 and 73 (with the switches 63 and 71 OFF) to ultimately increase the first offset-correction signal VCALP and decrease the second offset-correction signal VCALM to decrease IP1 as controlled and increase (or reduce the reduction of) IM1 as controlled. The pulse NEG turns ON the switches 63 and 71 (with the switches 61 and 73 OFF) to ultimately decrease the first offset-correction signal VCALP and increase the second offset-correction signal VCALM to increase (or reduce the reduction of) IP1 as controlled and decrease IM1 as controlled. The pulse SW turns on the sharing switches 65 and 75.

In the charging operation, or "phase 1", or "precharge phase", based on the comparator output, the supply capacitors 62 and 72 are charged ("precharged") to VREFP or VREFM with POS=1 and NEG=0 or POS=0 and NEG=1. In the sharing operation (charge-sharing operation), or "phase 2", or "charge sharing phase", the charges on the supply capacitors 62 and 72 are shared with the holding capacitors 64 and 74, respectively (with POS=0, NEG=0, and SW=1). After charge sharing the differential voltage VCALP-VCALM is updated based on the ratio of the capacitance between the supply and holding capacitors i.e. 62 to 64, and 72 to 74.

The offset-correction components 66 and 76 are shown in FIG. 5 as transistors, in particular NMOS MOSFETs (generally, n-channel FETs). The offset-correction components 66 and 76 may be other transistors, or other components configured to cause a voltage/current change based on a said applied offset-correction signal.

The charging-operation voltage supply for the first offset-correction circuit 60 may be the same as or different from the charging-operation voltage supply for the second offset-correction circuit 70. The supply capacitors 62 and 72 may have equal or different capacitances. The holding capacitors 64 and 74 may have equal or different capacitances.

The "offset correction range" (i.e. to what magnitude the intermediate signals IP1 and IM1 can be adjusted in each iteration) is determined by the charging-operation voltage supply, or by the first and second reference voltage supplies VREFP, VREFM. The resolution of the offset-correction circuitry 50 is determined (at least partly) by the capacitance ratio Cx/Cy, where Cx is the capacitance of each supply capacitor 62 and 72 and Cy is the capacitance of each holding capacitor 64 and 74.

The controller 55 may algorithmically control the switching circuitry for example by using PID (proportional-integral-derivative) techniques.

Figure 6:
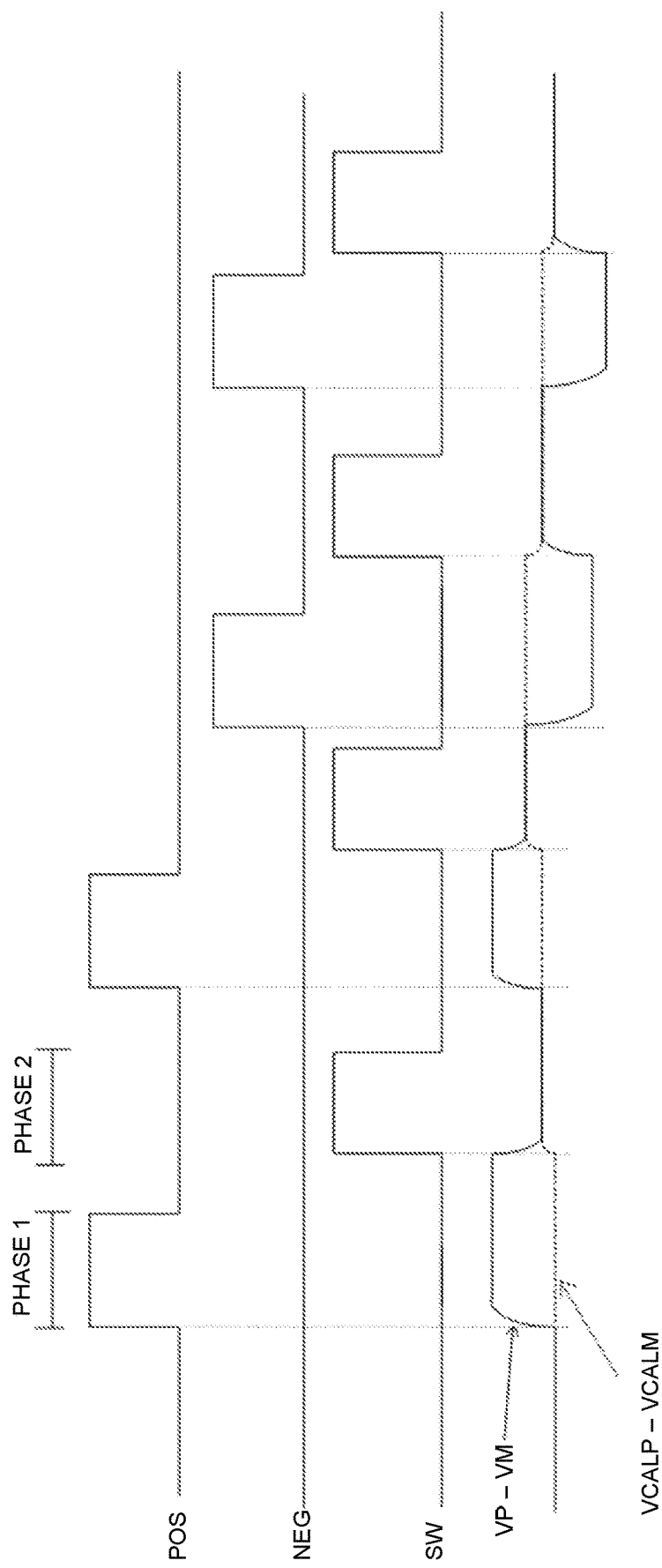
FIG. 6 is a graph useful for understanding FIG. 5.

FIG. 6 is a timing diagram useful for understanding the operation of the comparator 100. The uppermost graph shows the pulse signal POS, the second graph shows the pulse signal NEG, the third graph shows the pulse signal SW, and the final graph shows, together, the differential voltages VP-VM (where VP is the voltage at the node labelled VP and VM is the voltage at the node labelled VM) and VCALP-VCALM.

A pulse (of logic "1", for example) in POS (NEG and SW are at logic "0") causes VP-VM to rise (to a value defined by VREFP−VREFM) in phase 1, and then in phase 2, with POS and NEG low (e.g. logic "0"), a pulse in SW causes charge-sharing between the supply and holding capacitors 62, 72, 64, and 74 and thus causes VP-VM to decrease and VCALP-VCALM to increase. In another iteration, another pulse in POS in a phase 1 causes VP-VM to increase (to the value defined by VREFP−VREFM), and in a phase 2 another pulse in SW causes VP-VM to decrease and VCALP-VCALM to increase. With each of these two iterations the value VCALP-VCALM is incrementally increased.

In another iteration, a pulse in NEG (POS and SW are at logic "0") causes VP-VM to decrease (to a value defined by VREFM−VREFP) in a phase 1, and then in a phase 2, with POS and NEG low, a pulse in SW causes VP-VM to increase and VCALP-VCALM to decrease. In another iteration, another pulse in NEG causes VP-VM to decrease (to the value defined by VREFM−VREFP) in a phase 1, and then in a phase 2 a pulse in SW causes VP-VM to increase and VCALP-VCALM to decrease. With each of these two iterations the value VCALP-VCALM is incrementally decreased.

A "normal" calibration mode may thus correspond to supplying NEG or POS pulses based on OUTP and OUTM (i.e. the comparison results), each followed by an SW pulse, until successive comparison results (obtained in that calibration mode) differ from one another.

The control of POS, NEG, and SW is of course determined by the controller 55 based on OUTP and OUTM.

Referring back to FIG. 5, the controller 55 is configured to control the first and/or second offset-correction circuits 60 and 70 to control an amount by, or a rate at, which the offset-correction signal concerned is adjusted (in instances of a charging operation followed by a charge-sharing operation), and/or or to carry out a bypass operation. The control is based on a control signal (shown as C). Generally, an amount may be considered to comprise a rate.

For example, the control signal may be employed to control the first and/or second offset-correction circuits 60 and 70 such that they carry out a bypass operation and then at least one instance of a charging operation followed by a charge-sharing operation. As another example, the control signal may be employed to control the first and/or second offset-correction circuits 60 and 70 such that they carry out at least one instance of a charging operation followed by a charge-sharing operation. As another example, the control signal may be employed to control the first and/or second offset-correction circuits 60 and 70 such that they carry out a succession of instances of a charging operation followed by a charge-sharing operation, with the amount by, or a rate at, which the offset-correction signal(s) concerned are adjusted being different from one instance to another, or even from each (or more than one) instance to another.

The controller 55 comprises determination circuitry configured to determine a target amount or rate of adjustment of the offset-correction signal concerned and to control the control signal (or an amount-control or rate-control signal thereof) to control the amount by which, or the rate at which, the offset-correction signal concerned is adjusted to bring that amount/rate to or towards the target amount/rate.

In an implementation, the controller 55 adjusts the charging-operation voltage supply based on the control signal to control the amount by which, or rate at which, the first and/or second offset-correction signal is adjusted. For example, the controller 55 controls the first and/or second reference voltage supplies VREFP, VREFM (i.e. changes the voltage levels thereof) to change the amount by which, or rate at which, the first and/or second offset-correction signal is adjusted. This may be considered as adjusting the "step size" of the adjustment of an offset-correction signal. In other words, referring to FIG. 6, the change in phase 2 (compared to the preceding phase 1 or 2) of the voltage VCALP-VCALM may be made larger or smaller by adjusting the first and/or second reference voltage supplies VREFP, VREFM. Adjusting the step size (the incremental changes mentioned earlier) may be considered adjusting the gain and/or sensitivity of the offset correction circuit 50 (and corresponds to adjusting the amount by which, or rate at which, the offset-correction signal concerned is adjusted).

In an implementation, the step size (amount or rate of adjustment of an offset-correction signal) is changed by the controller 55 (by adjusting the first and/or second reference voltage supply VREFP, VREFM) so that the step size is larger at the start of calibration to perform a "coarse calibration" and smaller thereafter to perform a "fine calibration". Generally, the step size may be controlled so that it is different from one instance (of a charging operation followed by a charge-sharing operation) to another, or even from each (or more than one) instance to another. That is, the step size can be changed "on the fly" for faster convergence—i.e. to correct or compensate for the offset faster (at least, initially, or until the offset is reduced to below a threshold value).

In an implementation, the first and/or second reference voltage supplies (or the charging-operation voltage supply) are adjusted to reduce the differential voltage VREFP−VREFM to a minimum (or a "low" value, i.e. it could be further lowered in theory) to reduce ripple in the intermediate signals IP1 and IM1 caused by the offset correction circuitry 50. That is, the step size or amount by which the offset-correction signal(s) are adjusted by may be reduced to such a low value (e.g. after instances of a charging operation followed by a charge-sharing operation have been carried out with a higher value).

In an implementation the common mode voltage of the first and second reference voltage supplies may be adjusted so that the timing is consistent between the comparator circuitry 40 and the offset correction circuitry 50. For example, the CLK signal will have a finite rise/fall time in practice so keeping the common mode (of the first and second reference voltage supplies) consistent with the common mode of the signals of the comparator circuitry 40 helps the offset correction circuitry 50 to contribute to adding/removing current from the IP1/IM1 nodes at the right time.

In an implementation the common mode voltage of the first and second reference voltage supplies (or the voltage of either one of those supplies) may be adjusted in a "maintenance" operation between instances of a charging operation followed by a charge-sharing operation, i.e. between calibration cycles, to reduce effects of switch (active device) and/or capacitor leakage on performance. For example, in practice there will be a degree of charge leakage from the capacitors and also across the switches even when they are open. By adjusting the first and/or second reference voltage supplies or their common mode, the charge leakage across the switches may be controlled to at least partly compensate for charge leakage from the capacitors (in particular capacitors 64 and/or 74), so that the voltage across capacitors 64 and/or 74 at the end of a calibration cycle (one or a series of instances of a charging operation followed by a charge-sharing operation) is maintained for longer (i.e. during the maintenance operation). Such control could be based on a measure of the voltage across capacitors 64 and/or 74 (or even the voltage at IP1 and/or IM1) or based on a history of the comparison results. Such a technique reduces the effects of leakage and therefore reduces the need to keep performing calibration (so frequently). That is, calibration (i.e. adjustment of the offset-correction signals VCALP and VCALM) may be performed less frequently but still achieve the same or similar results in terms of offset cancellation.

Returning to the calibration itself, the reference voltage supply value(s) required for the initial compensation may be known due to a known offset in the comparator circuitry 40, or may be estimated based e.g. on a history of comparison results. The offset may be (roughly) known based on previous calibration that was performed on the comparator circuitry 40 e.g. before the system was reset (since the offset is at least partly caused by mismatch between the input gate transistors 42, 44 it may be the same or similar each time the circuit is used or calibrated). That is, the determination circuitry may be configured to determine the target amount/rate based on a history of compensation or comparison results. The offset may be known because the controller 55 "measured" the offset, as described below.

In an implementation, the controller 55, in a bypass operation, connects the input terminal of the offset-correction component 66 and/or 76 to a bypass-operation reference voltage supply to control the offset-correction signal VCALP and/or VCALM based on a voltage level of the bypass-operation voltage supply. The bypass-operation voltage supply may be the charging-operation voltage supply or another voltage supply.

The controller 55, in an implementation, adjusts the bypass-operation voltage supply (with the inputs to the comparator circuitry 40 being identical, i.e. shorted together) until the comparator outputs OUTP and OUTM flip to indicate the first intermediate signal IP1 increased/decreased past the second intermediate signal IM1, In this state, the offset-correction signals VCALP and VCALM may be at or near their desired values (to at least partly compensate for the comparator offset). Also, the VCALP and VCALM signals will be stored on the holding capacitors 64 and 74, and calibration in the "normal" calibration mode may continue from there (having been able to start much closer to the desired values than if the bypass operation were not performed).

The controller 55 may connect the input terminal of the first offset-correction component 66 to a bypass-operation reference voltage supply by closing either of switches 61 and 63, and by closing switch 65, thereby using the charging-operation voltage supply (or the first or second reference voltage supply VREF, VREFM) as the bypass-operation voltage supply, with corresponding considerations for the second offset correction circuit 70. The bypass operation may used for testing/debugging purposes.

In a modified bypass operation, the controller 55 connects the input terminal of the first and/or second offset-correction component 66, 76 to a bypass-operation reference voltage supply as described above and optionally adjusts bypass-operation reference voltage supply to apply a particular voltage VP and/or VM to ultimately adjust the intermediate signal IP1 and/or IM1 by a particular amount. For example, this may be used if the offset in the comparator circuitry 40 that needs to be corrected is (roughly) known or can be estimated. In that case, the controller 55 effectively adjusts the intermediate signal IP1 and/or IM1 by a particular amount to initially compensate the offset by an amount, and then the normal calibration mode can be used to control the intermediate signals IP1 and IM1 based on the comparator outputs OUTP, OUTM. This initial compensation of the offset may be considered a coarse adjustment/calibration and the subsequent "normal" calibration mode may be considered a fine adjustment/calibration.

Put another way, the controller 55, in an implementation, adjusts the bypass-operation voltage supply (with the inputs to the comparator circuitry 40 being identical, i.e. shorted together), for the offset-correction component 66 and/or 76, to a defined or estimated value. In this state, the offset-correction signals VCALP and VCALM may be at or near their desired values (to at least partly compensate for the comparator offset). Also, the VCALP and VCALM signals will be stored on the holding capacitors 64 and 74, and calibration in the "normal" calibration mode may continue from there (having been able to start closer to the desired values than if the bypass operation were not performed).

The charging-operation voltage supply and/or the first and/or second reference voltage supplies VREFP, VREFM and/or the bypass operation voltage supply may each be driven by a DAC.

In an implementation, the determination circuitry is configured to determine the target amount/rate based on any of a defined performance specification, a history of the comparison results, a history of amounts/rates, and a history of determined target amounts/rates. For example, a performance specification may specify a speed of calibration or a time limit to correct/compensate the offset, and therefore the rate-control signal may cause the controller 55 to adjust the charging-operation voltage supply to increase the step-size (at least initially as a coarse calibration) to try to correct/compensate the offset in the limited amount of time. For example, determining the target amount/rate based on a history of determined target amounts/rates may include using a previously determined target amount/rate or an average of previously determined target amounts/rates.

Determining the target amount/rate based on a history of determined target amounts/rates may include setting a current target amount/rate relative to a previously determined target amount/rate e.g. to increase or decrease the target amount/rate. The performance specification may define a target amount/rate of adjustment of the intermediate signals IP1 and IM1 and the controller 55 may convert that target amount/rate to a target amount/rate of adjustment of the first and/or second offset-correction signal VCALP, VCALM.

In some implementations the controller 55 is configured to control the first and/or second offset-correction circuit 60, 70, to control the rate at which, or amount by which, the offset-correction signal concerned is adjusted by controlling for that offset-correction circuit a capacitance of the holding capacitor 64, 74, and/or a capacitance of the supply capacitor 62, 72. That is, such capacitors may be variable capacitors.

The controller 55 in some implementations also or alternatively controls the switching circuitry to control when the charging operation and/or charge-sharing operation is carried out, and/or to control a duration of the charging and/or charge-sharing operation. For example, the rate at which (or amount by which) the offset-correction signal concerned is adjusted will be increased if the frequency of the charging and charge-sharing operations is increased. And the step size of each adjustment to the offset-correction signal may be smaller if the charging operation and/or charge-sharing operation is/are shorter in duration.

The controller 55 in some implementations also or alternatively controls the switching circuitry to control when the bypass operation is carried out, and/or to control a duration of the bypass operation.

Comparisons between the comparative examples and the comparator 100 will now be discussed. Considering the comparator 10, an example required resolution is below 62.5 µV. With e.g. a 0.9 V supply the DACs 14A and 14B would need to have a resolution of at least 14 bits. A 14 bit DAC uses up a lot of area and is therefore undesirable.

Considering the comparator 20, the capacitor 18B in combination with the constant current source may be referred to as a charge pump design. It is difficult to achieve the example required resolution due to the transfer function of the circuit. That is, the amount of charge transferred to the capacitor 18B is equal to $Q=I*tclock$, where I is the current and tclock is the duration of a clock pulse of CLK_OUTM or CLK_OUTP. Therefore the magnitude of the signal controlling the transistor 26B is $Vcal=I*tclock/C$, where C is the capacitance of the capacitor 18B. If e.g. C=2 pF, tclock=200 ps, and Vcal=62.5 µV (the required resolution), then the current I would need to be 0.625 nA. Designing a circuit for such a small current is difficult and is undesirable.

Turning to the comparator 100, the two capacitors 62 and 64, 72 and 74 are used to transfer a known amount of charge to achieve a high resolution. For example, by choosing Cx=4 fF and Cy=2 pF, to obtain a ΔVCALP equal to 62.5 µV (the example required resolution), VREFP and VREFM may be generated such that VREFP−VREFM<62.5 µV*Cx/Cy, and thus VREFP−VREFM<31.25 mV, which is a more practical design requirement than equivalent requirements for the comparators 10 and 20 necessary to achieve the example required resolution.

An advantage of the high-speed and low offset comparator 100 is to be able to reach a very high resolution, and with a mostly passive implementation the current consumption is very low. Moreover, power is used only when calibration (adjustment of the first and/or second offset-correction signal) is needed.

Figure 7:
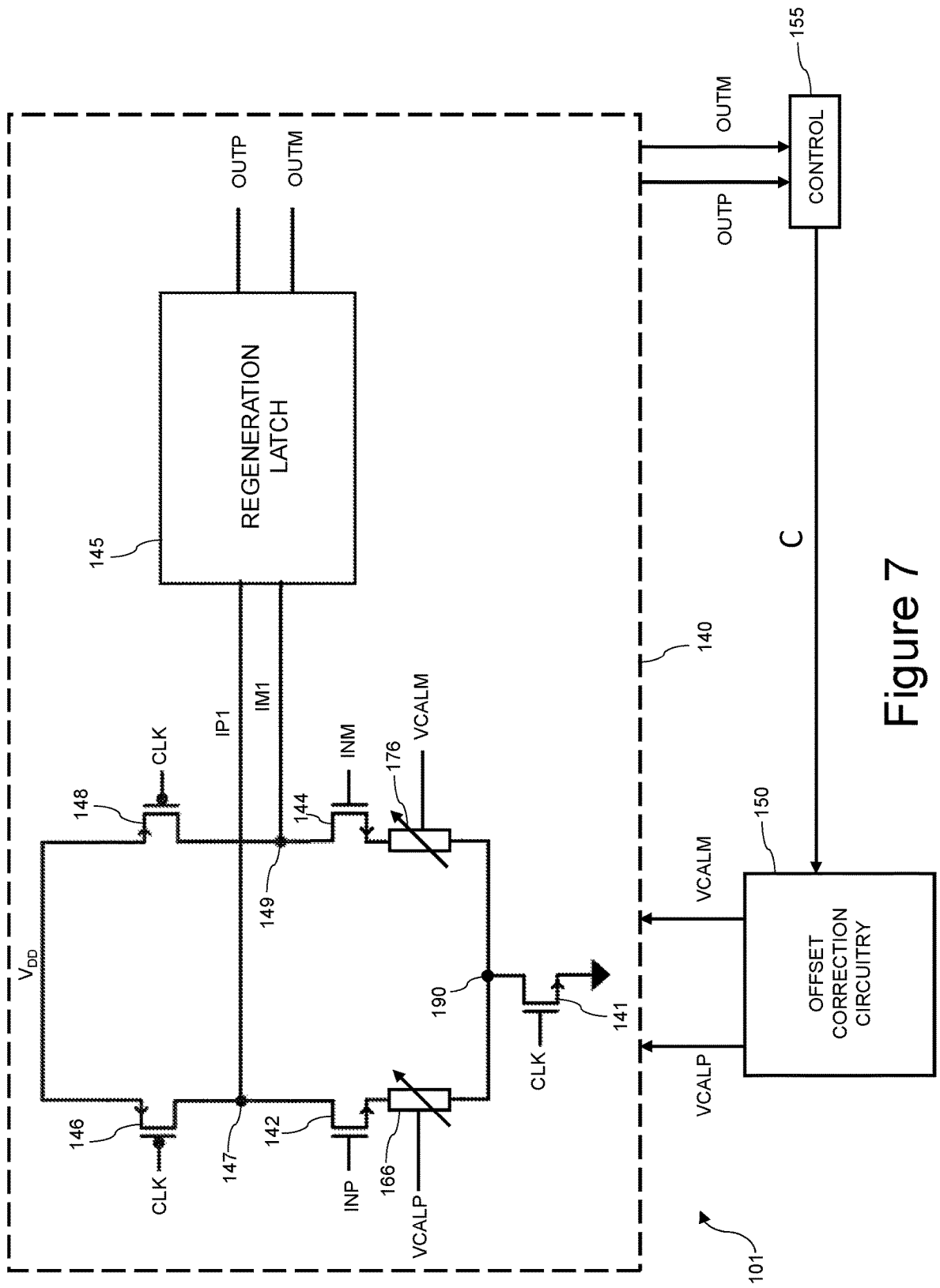
FIG. 7 is a schematic diagram of a comparator.

FIG. 7 is a schematic diagram of a part of a comparator 101. The elements of the comparator 101 have been given the same reference numerals as in the comparator 100 but with an additional "1" at the start. The comparator 101 is the same as the comparator 100 except for its offset-correction components and connections thereto. The offset-correction components 166 and 176 in the comparator 101 act as variable resistors (although they may be implemented as transistors). The first variable resistor 166 is connected in series with the first input gate transistor 142 (between the first input gate transistor 142 and the tail node 190, corresponding to node 324 in FIG. 1) to control the intermediate signal IP1 and the second variable resistor 176 is connected in series with the second input gate transistor 144 (between the second input gate transistor 144 and the tail node 190) to control the intermediate signal IM1. Effectively, in this arrangement source degeneration is implemented, with the resistors 166 and 176 effectively controlling the gains of the transistors 142 and 144, respectively.

The first and second variable resistors 166 and 176 are controlled respectively by the first and second offset-correction signals VCALP and VCALM in manner corresponding to the comparator 100.

The offset correction circuitry 150 and the controller 155 for the comparator 101 are not shown in detail in FIG. 7 but may be the same as, and may work in the same way as, the offset-correction circuit 50 and the controller 55, respectively. Considerations regarding the comparator 100 (e.g. the amount by which, or rate at which, the offset-correction signal concerned is adjusted, the determination circuitry, the basis on which the target amount/rate is determined, etc.) apply equally to the comparator 101.

Considering the comparators 100 and 101, the offset correction circuitry 50, 150 may comprise only one offset-correction component 66, 166, or 76, 176, to control only one of the intermediate signals IP1, IM1. In this case the offset correction circuitry 50, 150 may also comprise only one offset-correction circuit 60, 70 for supplying an offset-correction signal to the offset correction component 66, 166, or 76, 176. As indicated above, the offset correction circuitry 50, 150 may comprise both offset-correction circuits 60 and 70 and both offset-correction components 66 and 76, 166 and 176, but the controller 55, 155 may adjust only one of the offset-correction signals or both of them.

Figure 8:
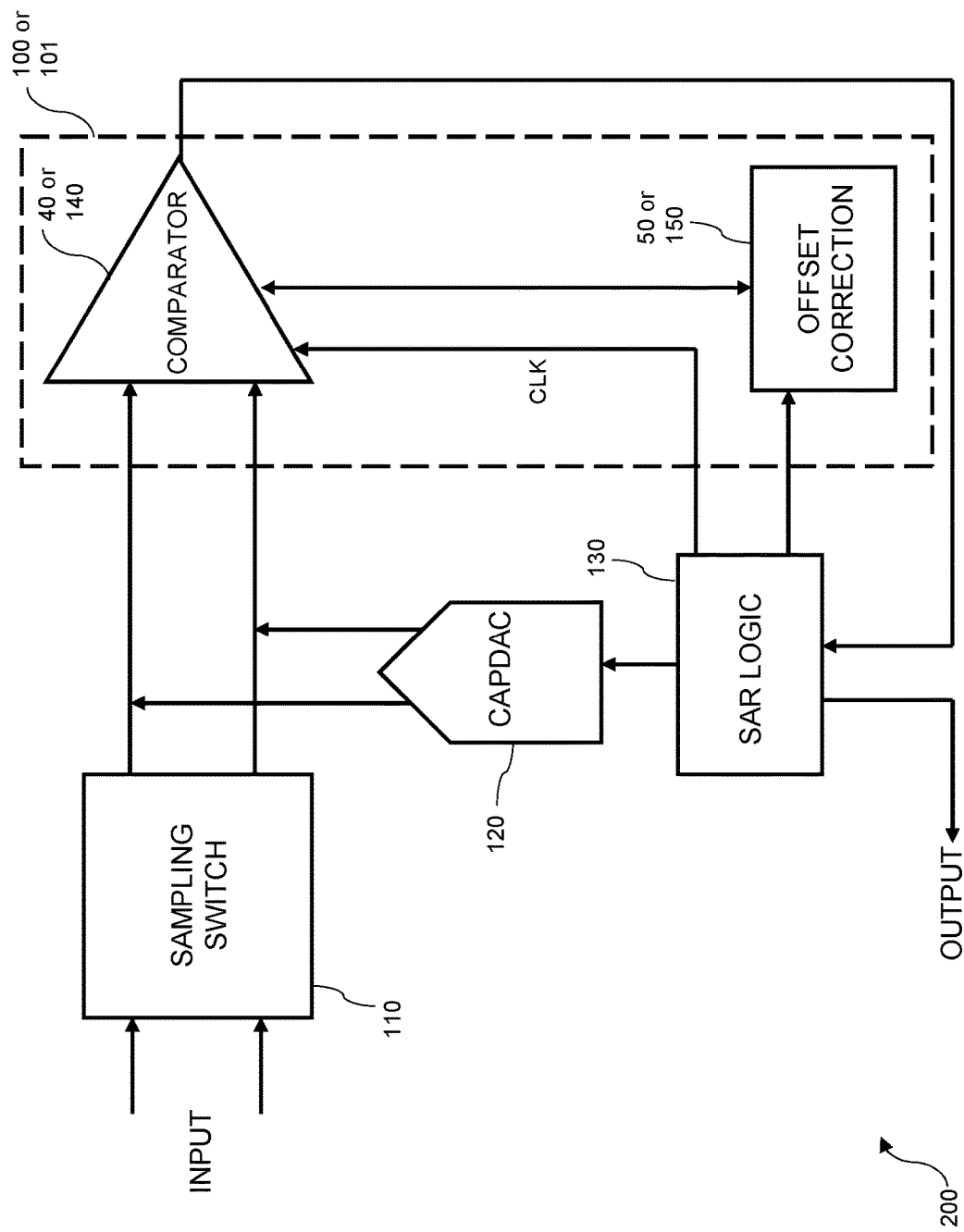
FIG. 8 is a schematic diagram of an ADC.

FIG. 8 is a schematic diagram of an ADC 200, in particular an SAR (successive approximation register) ADC 200. The ADC 200 comprises a sampling switch 110, a comparator which is the comparator 100 or 101, SAR logic 130, and a CAPDAC (capacitance digital-to-analogue converter) 120. The sampling switch samples an input and outputs the result to the comparator 100 or 101 whose output is received by the SAR logic 130. The SAR logic controls the CAPDAC 120 to adjust the inputs to the comparator 100 or 101 in a feedback loop. The SAR logic 120 also outputs the result of the ADC.

The controller 55, 155 may be considered to be a part of the SAR logic 130, as demonstrated by the arrow indicating that the SAR logic 120 controls the offset correction circuit 50, 150. The SAR logic 130 also controls the comparator 100 or 101 with the clock signal CLK.

The comparator 100 or 101 can also be used in other circuitry, for example in a high speed SerDes (Serializer/Deserializer) receiver.

Comparators disclosed herein may be summarized as comprising: first and second input transistors connected to control signals at first and second nodes of the comparator based on first and second input signals, respectively; latch circuitry; at least one controllable offset-correction component having an input terminal and connected to control the signal at one of the first and second nodes based on an offset-correction signal provided at its input terminal; for each controllable offset-correction component, an offset correction circuit configured to provide the offset-correction signal provided at its input terminal; and control circuitry. The at least one offset-correction circuit comprises a holding capacitor, a supply capacitor and switching circuitry. For the at least one offset-correction circuit, the switching circuitry is configured, in a charging operation, to connect the supply capacitor to a charging-operation voltage supply to store charge on that capacitor, and, in a charge-sharing operation, to disconnect the supply capacitor from the charging-operation voltage supply and connect it to the holding capacitor. The control circuitry is configured, based on a control signal, to control the at least one offset-correction circuit to: control an amount by which the offset-correction signal is adjusted; and/or in a bypass operation, connect the input terminal of the at least one controllable offset-correction component to a bypass-operation reference voltage supply; and/or in a maintenance operation, control the charging-operation voltage supply and/or the bypass-operation voltage supply to control leakage of the charge stored on the holding capacitor.

Figure 9:
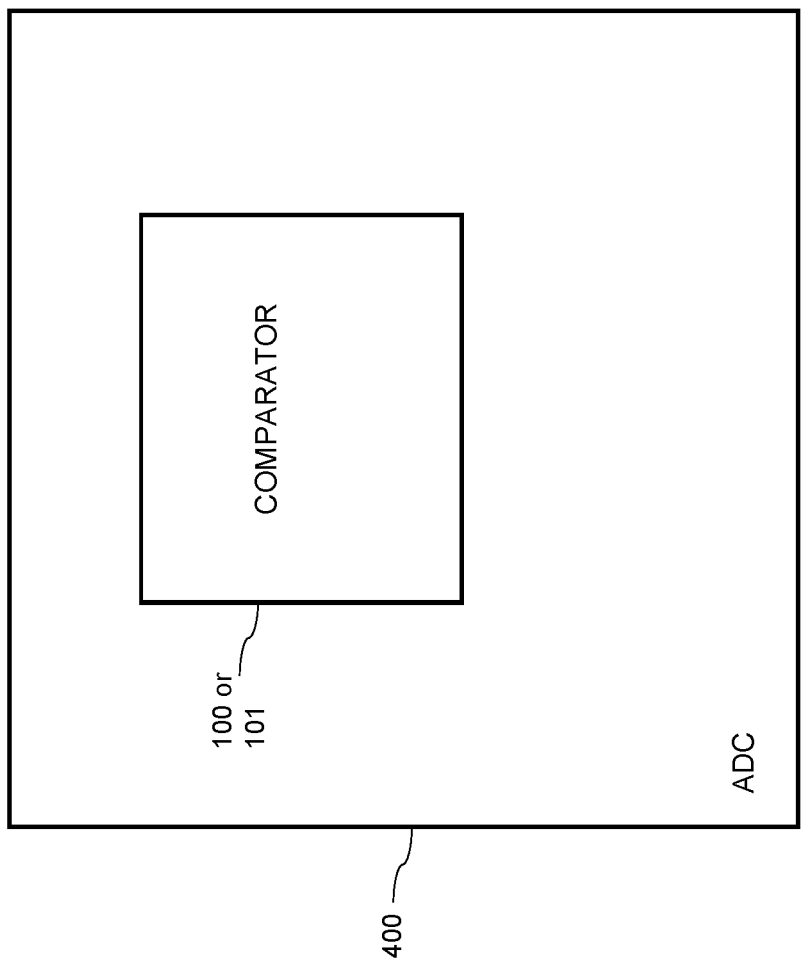
FIG. 9 is a schematic diagram of an ADC.

FIG. 9 is a schematic diagram of an ADC 400 comprising the comparator 100 or 101. The ADC 400 may be the same as the SAR ADC 200. The comparator 100 or 101 may of course be used in any circuitry requiring a comparator, since its design is portable to other technologies (it is technology-agnostic).

Figure 10:
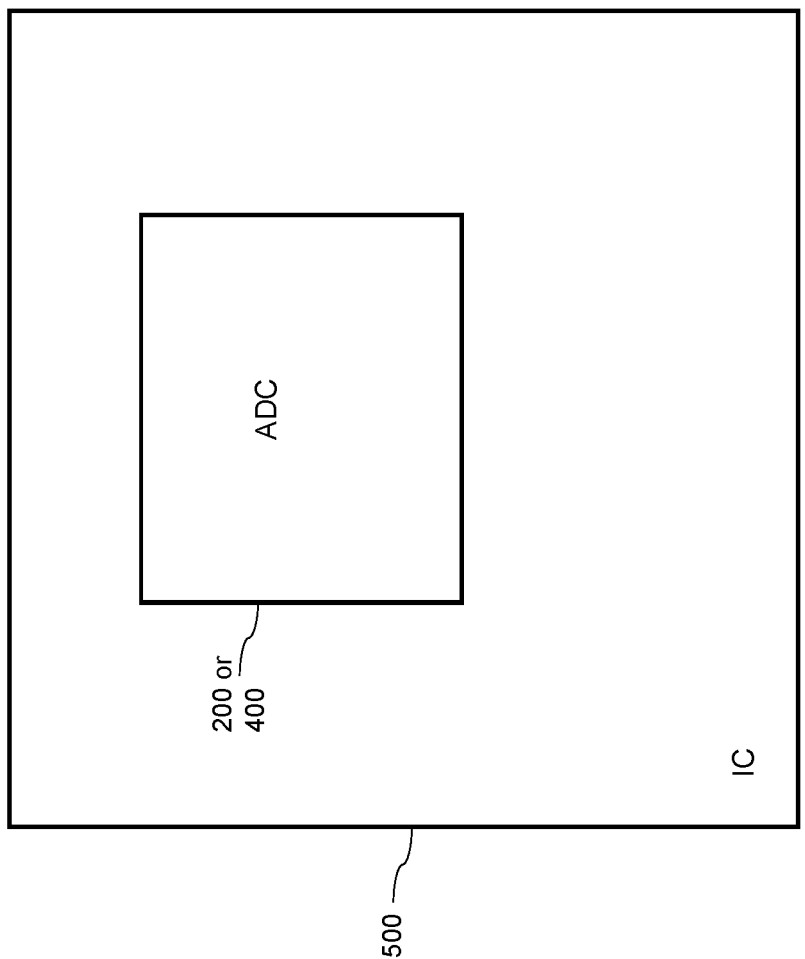
FIG. 10 is a schematic diagram of integrated circuitry.

FIG. 10 is a schematic diagram illustrating an integrated circuit (IC) 500 comprising the ADC 200 or 400.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

In any of the above aspects, various features such as the controller 55 or 155 may be implemented in hardware, or as software modules running on one or more processors/computers. The invention also provides a computer program or a computer program product comprising instructions which, when executed by a computer, cause the computer to carry out (as a method) the functionality of the controller 55 or 155 described herein, and a non-transitory computer-readable medium comprising instructions which, when executed by a computer, cause the computer to carry out any of the functionality/method/method steps described herein. A computer program embodying the invention may be stored on a non-transitory computer-readable medium, or it could be, for example, be in the form of a signal such as a downloadable data signal provided from an Internet website, or it could be in any other form.

The invention claimed is:

1. A comparator comprising:
   first and second input transistors connected to control signals at first and second nodes of the comparator based on first and second input signals, respectively; and
   latch circuitry configured to generate a comparator output signal indicative of successive comparison results based on the signals at the first and second nodes, each comparison result indicating whether a magnitude of the first input signal is determined to be larger than a magnitude of the second input signal or vice versa,
   wherein the comparator further comprises:
   at least one controllable offset-correction component having an input terminal and connected to control the signal at one of the first and second nodes based on an offset-correction signal provided at its input terminal;
   for each controllable offset-correction component, an offset correction circuit configured to provide the offset-correction signal provided at its input terminal; and
   control circuitry,
   wherein:
   the at least one offset-correction circuit comprises a holding capacitor, a supply capacitor and switching circuitry, the holding capacitor connected to the input terminal of the offset-correction component concerned and configured to provide the offset-correction signal at the input terminal concerned based on charge stored on that holding capacitor;
   for the at least one offset-correction circuit, the switching circuitry is configured, in a charging operation, to connect the supply capacitor to a charging-operation voltage supply to store charge on that capacitor, and, in a charge-sharing operation, to disconnect the supply capacitor from the charging-operation voltage supply and connect it to the holding capacitor to adjust the charge stored on the holding capacitor and thereby adjust the offset-correction signal; and
   the control circuitry is configured, based on a control signal, to control the at least one offset-correction circuit to:
   control an amount by which the offset-correction signal is adjusted, wherein the control circuitry comprises determination circuitry configured to determine a target amount of adjustment of the offset-correction signal, and to control the control signal to control the amount by which the offset-correction signal is adjusted to bring that amount to or towards the target amount; and/or
   in a bypass operation, connect the input terminal of the at least one controllable offset-correction component to a bypass-operation reference voltage supply to control the offset-correction signal based on a voltage level of the bypass-operation voltage supply, the bypass-operation voltage supply being the charging-operation voltage supply or another voltage supply; and/or
   in a maintenance operation between instances of a charging operation followed by a charge-sharing operation, control the charging-operation voltage supply and/or the bypass-operation voltage supply to control leakage of the charge stored on the holding capacitor,
   wherein for the at least one offset-correction circuit, the switching circuitry comprises a charging switch connected between the supply capacitor and the charging-operation voltage supply and a sharing switch connected between the supply capacitor and the holding capacitor; and
   the control circuitry is configured, for the at least one offset-correction circuit, to control the switching circuitry to:
   turn the charging switch ON and the sharing switch OFF to carry out the charging operation; and/or
   turn the charging switch OFF and the sharing switch ON to carry out the charge-sharing operation; and/or
   turn the charging switch ON and the sharing switch ON to carry out the bypass operation; and/or
   turn the charging switch OFF and the sharing switch OFF to carry out the maintenance operation,
   wherein for the at least one offset-correction circuit, the charging switch comprises a first charging switch connected between a first reference voltage supply and the supply capacitor and a second charging switch connected between a second reference voltage supply and the supply capacitor.

2. The comparator as claimed in claim 1, wherein the control circuitry is configured, based on the control signal, to control the at least one offset-correction circuit to control a rate at which the offset-correction signal is adjusted, wherein the control circuitry comprises the determination circuitry configured to determine a target rate of adjustment of the offset-correction signal, and to control the control signal to control the rate at which the offset-correction signal is adjusted to bring that rate to or towards the target rate.

3. The comparator as claimed in claim 1, wherein the determination circuitry is configured to determine the target amount and/or the target rate based on at least one of:
   a defined performance specification;
   a history of the comparison results;
   a history of amounts and/or determined target amounts; and
   a history of rates and/or determined target rates.

4. The comparator as claimed in claim 1, wherein the control circuitry is configured, in a calibration mode, to:
   control the first and second input signals such that they become equal; and
   control the switching circuitry of the at least one offset-correction circuit to alternate between charging and charge-sharing operations until successive comparison results differ from one another.

5. The comparator as claimed in claim 1, wherein the control circuitry is configured to control the at least one offset-correction circuit by controlling, for the at least one offset-correction circuit, at least one of:
   a voltage level of the charging-operation voltage supply;
   a capacitance of the holding capacitor;
   a capacitance of the supply capacitor;
   the switching circuitry to control when the charging operation and/or the charge-sharing operation is carried out; and
   the switching circuitry to control a duration of the charging operation and/or a duration of the charge-sharing operation.

6. The comparator as claimed in claim 1, wherein the charging-operation voltage supply comprises first and second reference voltage supplies, optionally wherein the control circuitry is configured to control, for the at least one offset-correction circuit, a voltage level of the charging-operation voltage supply by controlling which of the first and second reference voltage supplies the supply capacitor is connected to.

7. The comparator as claimed in claim 6, wherein the control circuitry is configured, for the at least one offset-correction circuit, to control the amount by which, or the rate at which, the offset-correction signal is adjusted by adjusting the charging-operation voltage supply or the first reference voltage supply or the second reference voltage supply.

8. The comparator as claimed in claim 1, wherein the control circuitry is configured to control the at least one offset-correction circuit by controlling, for the at least one offset-correction circuit, at least one of:
 the switching circuitry to control when the bypass operation is carried out; and
 a voltage level of the bypass-operation voltage supply.

9. The comparator as claimed in claim 1, wherein the control circuitry is configured to control the at least one offset-correction circuit, in a maintenance operation, to at least partly disconnect:
 the supply capacitor from the charging-operation voltage supply and/or the bypass-operation voltage supply; and/or
 the supply capacitor from the holding capacitor; and/or
 the holding capacitor from the charging-operation voltage supply and/or the bypass-operation voltage supply.

10. The comparator as claimed in claim 1, wherein the control circuitry is configured to control the at least one offset-correction circuit, in a maintenance operation, to control the charging-operation voltage supply and/or the bypass-operation voltage supply based on a measure of the offset-correction signal concerned or based on a history of the comparison results.

11. The comparator as claimed in claim 1, wherein for the at least one offset-correction circuit, wherein
 turning the charging switch ON comprises turning one of the first and second charging switches ON and the other of the first and second charging switches OFF, and
 optionally, turning the charging switch OFF comprises turning both the first and second charging switches OFF.

12. The comparator as claimed in claim 1, wherein the comparator comprises first and second said controllable offset correction components as the at least one controllable offset-correction component, the first and second controllable offset-correction components having respective said input terminals and connected to control the signals at the first and second nodes based on first and second said offset-correction signals provided at their input terminals, respectively.

13. An analogue-to-digital converter comprising a comparator, the comparator comprising:
 first and second input transistors connected to control signals at first and second nodes of the comparator based on first and second input signals, respectively; and
 latch circuitry configured to generate a comparator output signal indicative of successive comparison results based on the signals at the first and second nodes, each comparison result indicating whether a magnitude of the first input signal is determined to be larger than a magnitude of the second input signal or vice versa;
 wherein the comparator further comprises:

at least one controllable offset-correction component having an input terminal and connected to control the signal at one of the first and second nodes based on an offset-correction signal provided at its input terminal;
 for each controllable offset-correction component, an offset correction circuit configured to provide the offset-correction signal provided at its input terminal; and
 control circuitry,
wherein:
 the at least one offset-correction circuit comprises a holding capacitor, a supply capacitor and switching circuitry, the holding capacitor connected to the input terminal of the offset-correction component concerned and configured to provide the offset-correction signal at the input terminal concerned based on charge stored on that holding capacitor;
 for the at least one offset-correction circuit, the switching circuitry is configured, in a charging operation, to connect the supply capacitor to a charging-operation voltage supply to store charge on that capacitor, and, in a charge-sharing operation, to disconnect the supply capacitor from the charging-operation voltage supply and connect it to the holding capacitor to adjust the charge stored on the holding capacitor and thereby adjust the offset-correction signal; and
 the control circuitry is configured, based on a control signal, to control the at least one offset-correction circuit to:
  control an amount by which the offset-correction signal is adjusted, wherein the control circuitry comprises determination circuitry configured to determine a target amount of adjustment of the offset-correction signal, and to control the control signal to control the amount by which the offset-correction signal is adjusted to bring that amount to or towards the target amount; and/or
  in a bypass operation, connect the input terminal of the at least one controllable offset-correction component to a bypass-operation reference voltage supply to control the offset-correction signal based on a voltage level of the bypass-operation voltage supply, the bypass-operation voltage supply being the charging-operation voltage supply or another voltage supply: and/or
  in a maintenance operation between instances of a charging operation followed by a charge-sharing operation, control the charging-operation voltage supply and/or the bypass-operation voltage supply to control leakage of the charge stored on the holding capacitor,
 wherein for the at least one offset-correction circuit, the switching circuitry comprises a charging switch connected between the supply capacitor and the charging-operation voltage supply and a sharing switch connected between the supply capacitor and the holding capacitor; and
 the control circuitry is configured, for the at least one offset-correction circuit, to control the switching circuitry to:
  turn the charging switch ON and the sharing switch OFF to carry out the charging operation; and/or
  turn the charging switch OFF and the sharing switch ON to carry out the charge-sharing operation; and/or
  turn the charging switch ON and the sharing switch ON to carry out the bypass operation; and/or
  turn the charging switch OFF and the sharing switch OFF to carry out the maintenance operation, wherein for the at least one offset-correction circuit, the charging switch comprises a first charging switch connected between a first reference voltage supply and the supply capacitor and a second charging switch connected between a second reference voltage supply and the supply capacitor.

14. Integrated circuitry, such as an IC chip, comprising a comparator, the comparator comprising:

first and second input transistors connected to control signals at first and second nodes of the comparator based on first and second input signals, respectively; and latch circuitry configured to generate a comparator output signal indicative of successive comparison results based on the signals at the first and second nodes, each comparison result indicating whether a magnitude of the first input signal is determined to be larger than a magnitude of the second input signal or vice versa;

wherein the comparator further comprises:

at least one controllable offset-correction component having an input terminal and connected to control the signal at one of the first and second nodes based on an offset-correction signal provided at its input terminal;

for each controllable offset-correction component, an offset correction circuit configured to provide the offset-correction signal provided at its input terminal; and control circuitry, wherein:

the at least one offset-correction circuit comprises a holding capacitor, a supply capacitor and switching circuitry, the holding capacitor connected to the input terminal of the offset-correction component concerned and configured to provide the offset-correction signal at the input terminal concerned based on charge stored on that holding capacitor;

for the at least one offset-correction circuit, the switching circuitry is configured, in a charging operation, to connect the supply capacitor to a charging-operation voltage supply to store charge on that capacitor, and, in a charge-sharing operation, to disconnect the supply capacitor from the charging-operation voltage supply and connect it to the holding capacitor to adjust the charge stored on the holding capacitor and thereby adjust the offset-correction signal; and the control circuitry is configured, based on a control signal, to control the at least one offset-correction circuit to:

control an amount by which the offset-correction signal is adjusted, wherein the control circuitry comprises determination circuitry configured to determine a target amount of adjustment of the offset-correction signal, and to control the control signal to control the amount by which the offset-correction signal is adjusted to bring that amount to or towards the target amount; and/or in a bypass operation, connect the input terminal of the at least one controllable offset-correction component to a bypass-operation reference voltage supply to control the offset-correction signal based on a voltage level of the bypass-operation voltage supply, the bypass-operation voltage supply being the charging-operation voltage supply or another voltage supply; and/or in a maintenance operation between instances of a charging operation followed by a charge-sharing operation, control the charging-operation voltage supply and/or the bypass-operation voltage supply to control leakage of the charge stored on the holding capacitor, wherein for the at least one offset-correction circuit, the switching circuitry comprises a charging switch connected between the supply capacitor and the charging-operation voltage supply and a sharing switch connected between the supply capacitor and the holding capacitor; and the control circuitry is configured, for the at least one offset-correction circuit, to control the switching circuitry to:

turn the charging switch ON and the sharing switch OFF to carry out the charging operation; and/or turn the charging switch OFF and the sharing switch ON to carry out the charge-sharing operation; and/or turn the charging switch ON and the sharing switch ON to carry out the bypass operation; and/or turn the charging switch OFF and the sharing switch OFF to carry out the maintenance operation, wherein for the at least one offset-correction circuit, the charging switch comprises a first charging switch connected between a first reference voltage supply and the supply capacitor and a second charging switch connected between a second reference voltage supply and the supply capacitor.

15. Integrated circuitry, such as an IC chip, comprising a comparator, the comparator comprising:

first and second input transistors connected to control signals at first and second nodes of the comparator based on first and second input signals, respectively; and latch circuitry configured to generate a comparator output signal indicative of successive comparison results based on the signals at the first and second nodes, each comparison result indicating whether a magnitude of the first input signal is determined to be larger than a magnitude of the second input signal or vice versa;

wherein the comparator further comprises:

at least one controllable offset-correction component having an input terminal and connected to control the signal at one of the first and second nodes based on an offset-correction signal provided at its input terminal;

for each controllable offset-correction component, an offset correction circuit configured to provide the offset-correction signal provided at its input terminal; and control circuitry, wherein:

the at least one offset-correction circuit comprises a holding capacitor, a supply capacitor and switching circuitry, the holding capacitor connected to the input terminal of the offset-correction component concerned and configured to provide the offset-correction signal at the input terminal concerned based on charge stored on that holding capacitor;

for the at least one offset-correction circuit, the switching circuitry is configured, in a charging operation, to connect the supply capacitor to a charging-operation voltage supply to store charge on that capacitor, and, in a charge-sharing operation, to disconnect the supply capacitor from the charging-operation voltage supply and connect it to the holding capacitor to adjust the charge stored on the holding capacitor and thereby adjust the offset-correction signal; and the control circuitry is configured, based on a control signal, to control the at least one offset-correction circuit to:

control an amount by which the offset-correction signal is adjusted, wherein the control circuitry comprises determination circuitry configured to determine a target amount of adjustment of the offset-correction signal, and to control the control signal to control the amount by which the offset-correction signal is adjusted to bring that amount to or towards the target amount; and/or in a bypass operation, connect the input terminal of the at least one controllable offset-correction component to a bypass-operation reference voltage supply to control the offset-correction signal based on a voltage level of the bypass-operation voltage supply, the bypass-operation voltage supply being the charging-operation voltage supply or another voltage supply; and/or in a maintenance operation between instances of a charging operation followed by a charge-sharing operation, control the charging-operation voltage supply and/or the bypass-operation voltage supply to control leakage of the charge stored on the holding capacitor, wherein for the at least one offset-correction circuit, the switching circuitry comprises a charging switch connected between the supply capacitor and the charging-operation voltage supply and a sharing switch connected between the supply capacitor and the holding capacitor; and the control circuitry is configured, for the at least one offset-correction circuit, to control the switching circuitry to:

turn the charging switch ON and the sharing switch OFF to carry out the charging operation; and/or turn the charging switch OFF and the sharing switch ON to carry out the charge-sharing operation; and/or turn the charging switch ON and the sharing switch ON to carry out the bypass operation; and/or turn the charging switch OFF and the sharing switch OFF to carry out the maintenance operation, wherein for the at least one offset-correction circuit, the charging switch comprises a first charging switch connected between a first reference voltage supply and the supply capacitor and a second charging switch connected between a second reference voltage supply and the supply capacitor.

* * * * *